(12) United States Patent
Watt et al.

(10) Patent No.: US 9,131,604 B1
(45) Date of Patent: Sep. 8, 2015

(54) INTERTWINED PAIR OF CONDUCTIVE PATHS ARRANGED IN A DIELECTRIC STACK AND HAVING AT LEAST THREE METAL LAYERS

(75) Inventors: Jeffrey T. Watt, Palo Alto, CA (US); Shuxian Chen, Fremont, CA (US)

(73) Assignee: Altera Corporation, San Jose, CA (US)

( * ) Notice: Subject to any disclaimer, the term of this patent is extended or adjusted under 35 U.S.C. 154(b) by 868 days.

(21) Appl. No.: 13/078,701

(22) Filed: Apr. 1, 2011

(51) Int. Cl.
H05K 1/02 (2006.01)

(52) U.S. Cl.
CPC .................................. *H05K 1/0245* (2013.01)

(58) Field of Classification Search
CPC ................................................... H05K 1/0245
USPC ................... 333/1, 4, 5, 238, 246; 174/33, 36
See application file for complete search history.

(56) References Cited

U.S. PATENT DOCUMENTS

| | | | |
|---|---|---|---|
| 4,532,484 A | | 7/1985 | Tajima et al. |
| 4,626,889 A | * | 12/1986 | Yamamoto et al. ............ 257/773 |
| 5,262,740 A | | 11/1993 | Willems |
| 5,281,929 A | | 1/1994 | Willems |
| 5,646,368 A | * | 7/1997 | Muyshondt et al. ............. 174/33 |
| 6,347,041 B1 | * | 2/2002 | Hailey et al. ................... 361/777 |
| 6,396,000 B1 | * | 5/2002 | Baum ............................ 174/261 |
| 6,611,181 B2 | | 8/2003 | Marketkar et al. |
| 7,280,808 B2 | * | 10/2007 | Murray et al. ............. 455/114.2 |
| 7,554,829 B2 | * | 6/2009 | Forbes et al. ................... 365/51 |
| 8,058,943 B2 | * | 11/2011 | Lee ................................... 333/1 |
| 2003/0222727 A1 | * | 12/2003 | McCurdy et al. ................ 333/1 |
| 2011/0109379 A1 | * | 5/2011 | Onuki et al. ................... 327/551 |

OTHER PUBLICATIONS

Cheung et al., "Shielded Passive Devices for Silicon-Based Monolithic Microwave and Millimeter-Wave Integrated Circuits," p. 1183-1200, IEEE Journal of Solid-State Circuits, vol. 41, No. 5, May 2006.
Yu et al., "A 22-24 GHz 4-Element CMOS Phased Array With On-Chip Coupling Characterization," p. 2134-2143, IEEE Journal of Solid-State Circuits, vol. 43, No. 9, Sep. 2008.

* cited by examiner

*Primary Examiner* — Benny Lee
(74) *Attorney, Agent, or Firm* — Treyz Law Group; George Victor Treyz; Jason Tsai (57) ABSTRACT

A communications path may be formed from intertwined conductive paths. The intertwined conductive paths may be formed from one or more layers of conductive material in the dielectric stack of an integrated circuit. The dielectric stack may include metal layers, via layers, and a pad layer. The conductive paths may be formed from patterned conductive structures in the metal and pad layers. Vias in the via layers may be used to connect metal structures from multiple dielectric stack layers. The communications path may have segments in which the conductive paths run parallel to each other and may have cross-over regions in which the conductive paths cross one another without electrically connecting so that the paths twist about each other along their lengths. The communications path may be used to form a differential transmission line pair that distributes signals such as two-phase clock signals.

11 Claims, 6 Drawing Sheets

INTERTWINED PAIR OF CONDUCTIVE PATHS ARRANGED IN A DIELECTRIC STACK AND HAVING AT LEAST THREE METAL LAYERS

BACKGROUND

It is often necessary to distribute high-speed differential signals on integrated circuits. In a typical arrangement, the communications paths that are used in handing these signals take the form of a parallel set of conductors formed in one or more layers of the dielectric stack of the integrated circuit. A path of this type may sometimes be referred to as a differential transmission line pair.

During semiconductor manufacturing operations, the layers of a dielectric stack may be subject to chemical-mechanical polishing (CMP) operations. During CMP operations, the thickness of conductive lines may be affected by the presence or absence of nearby structures. Metals such as copper, from which interconnect structures are commonly formed, tend to be softer and more susceptible to thinning during polishing than surrounding silicon dioxide in the dielectric stack. A conductive line that is adjacent to a relatively small number of interconnect structures may therefore be somewhat protected during polishing by the correspondingly large amount of silicon dioxide near the conductive line. As a result, the conductive line may be thicker than expected and may have a relatively low resistance. If, however, a conductive line is adjacent to a relatively large number of interconnect structures and relatively small amount of silicon dioxide, the CMP polishing operation may be more effective than intended and the conductive line may be thinner and may have a higher resistance than expected.

When proximity-based polishing effects such as these affect the conductivity of the parallel lines in a differential transmission line pair, undesired impedance variations may be produced. These impedance variations may adversely affect performance. Communications paths based on parallel conductors may also be susceptible to cross-talk due to electromagnetic coupling with nearby communications paths.

SUMMARY OF THE INVENTION

A communications path such as a differential transmission line path may be formed from intertwined conductive lines (paths). The intertwined conductive lines (paths) may be formed from conductive structures in dielectric layers on a substrate such as an integrated circuit substrate.

A dielectric stack on an integrated circuit may contain interconnects. The dielectric stack may contain multiple layers of dielectric. The dielectric layers may include metal layers that are patterned to form interconnect lines and may include via layers that include short vertical conductors called vias. A pad layer may be formed on the top of the dielectric stack.

In the communications path, a pair of conductive lines may be intertwined to improve noise immunity and resistance to process variations from polishing effects. The path may have segments in which the lines run parallel to each other and interposed cross-over regions in which the lines cross one another without electrically connecting.

To reduce resistance, each of the conductive lines may be formed from structures in multiple layers of the dielectric stack. For example, a conductive line may be formed from a structure in a pad layer, a structure in an upper metal layer, a structure in a lower metal layer, etc., all of which are electrically coupled along their lengths using vias. In the cross-over regions, some of the metal layer patterns may be configured to form openings that allow the lines to cross each other without shorting. For example, if a pair of lines are formed from first and second metal layers in a dielectric stack, a cross-over region may contain a connecting line in the first metal layer that is associated with a first of the pair of lines and an electrically isolated connecting line in the second metal layer that is associated with a second of the pair of lines.

Further features of the invention, its nature and various advantages will be more apparent from the accompanying drawings and the following detailed description of the preferred embodiments.

DETAILED DESCRIPTION

Figure 1:
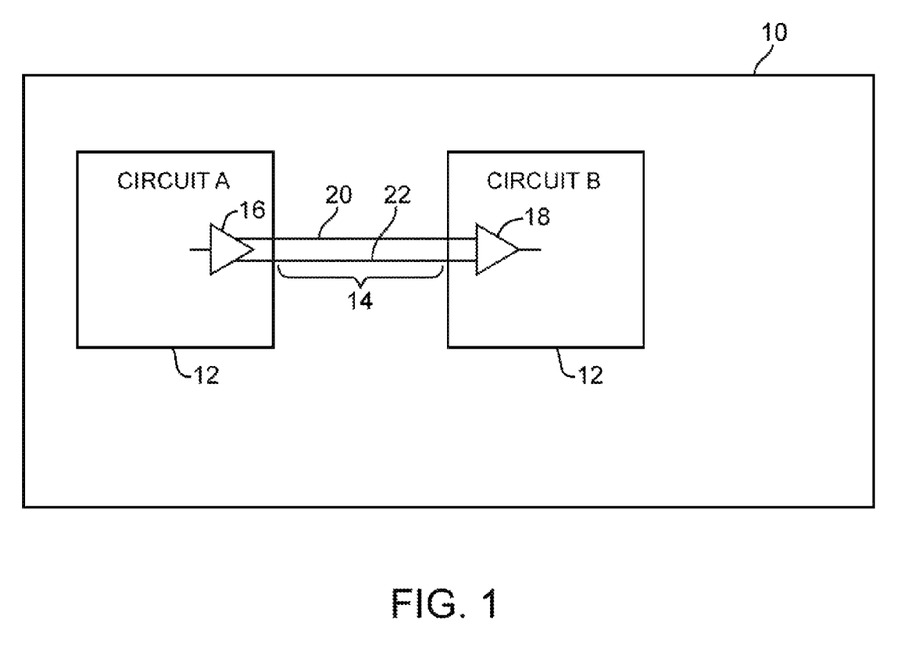
FIG. 1 is an exemplary diagram of an integrated circuit that includes communications paths in accordance with an embodiment of the present invention.

An integrated circuit may use communications paths in conveying signals between regions of circuitry on the integrated circuit. An exemplary arrangement is shown in FIG. 1. As shown in FIG. 1, integrated circuit 10 may include regions of circuitry 12 such as illustrative circuits A and B. Circuit A may be located on one portion of integrated circuit 10 and circuit B may be located at another portion of circuit 10.

To ensure that circuit A and circuit B can communicate with each other, one or more communications paths may be formed on integrated circuit 10. As shown in FIG. 1, for example, circuit A may be coupled to circuit B using communications path 14. Communications path 14 may include first conductor 20 and second conductor 22 and may form a differential transmission line pair. Signals may be transmitted onto path 14 using a transmitter such as differential output driver 16 in circuit A. The transmitted signals on path 14 may be received by receiver circuitry in circuit B such as differential signal receiver 18.

Transmitter 16 may, if desired, be a single-ended-to-differential signal transmitter that receives single-ended signals (i.e., signals that are referenced to ground) on its input and that produces corresponding differential output signals (i.e., signals that are referenced to each other) on a pair of differential outputs. Transmitters such as transmitter 16 may also be based on differential-to-differential circuits in which both the input and output signals to the transmitter are differential signals. The differential outputs may be coupled to conductors 20 and 22, respectively. Receiver 18 may be, for example, a differential-to-single-ended buffer that receives differential signals and converts them to single-ended signals or may be a differential-to-differential receiver that includes both differential inputs and differential outputs. Other types of transmitters and receivers may be used if desired. The illustrative configuration of FIG. 1 is merely an example. In a typical integrated circuit, there may be numerous sets of transmitters and receivers and associated communications paths (e.g., tens, hundreds, thousands, or more).

During the formation of integrated circuits, circuitry is formed within a semiconductor substrate. For example, in silicon-based integrated circuits, transistors such as metal-oxide-semiconductor (MOS) transistors and other circuits are formed within a silicon substrate.

Interconnects are typically formed in layers of dielectric that are formed on top of the silicon substrate. The dielectric layers above the silicon substrate, in which the interconnects are formed, are sometimes collectively referred to as the dielectric stack.

There may be numerous layers of dielectric in the dielectric stack portion of an integrated circuit. These layers may include so-called metal layers and via layers. The metal layers in the dielectric stack are dielectric layers that contain patterned metal structures such as metal lines. The via layers in the dielectric stack are dielectric layers that contain short vertical conductive structures called vias.

By forming various patterns of metal layer lines and vias in the dielectric stack, interconnect paths may be formed that electrically couple transistor circuits and other circuits on an integrated circuit in a desired pattern. The communications paths that are formed in the dielectric stack may include pairs of conductive lines that form differential signal paths (e.g., differential transmission line pairs).

Figure 2:
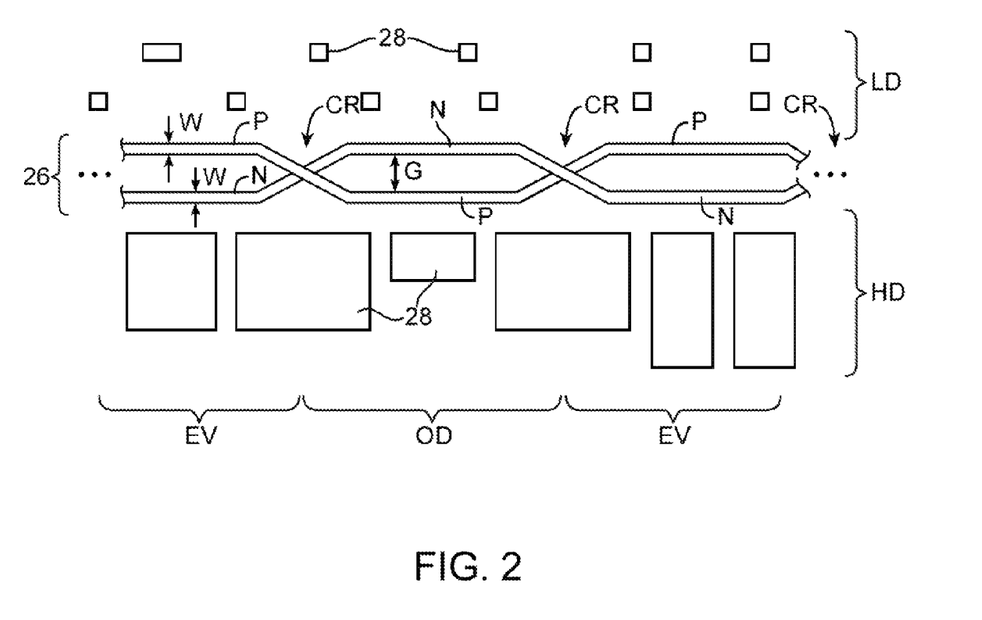
FIG. 2 is an exemplary top view of conductors forming intertwined conductors of an integrated circuit that are exposed to a similar density of adjacent structures in accordance with an embodiment of the present invention.

An exemplary arrangement of the type that may be used to improve communications path uniformity by intertwining the P and N conductive lines of a differential transmission line pair is shown in FIG. 2. Arrangements of the type shown in FIG. 2 exhibit improved signal quality and increased noise immunity (e.g., reduced cross-talk due to the shielding effect of twisting the conductive lines about one another) when compared to conventional arrangements.

As shown in FIG. 2, communications path 26 may have multiple segments. Segments EV may alternate with segments OD. Cross-over regions CR may be interposed between respective EV and OD segments to allow the conductors in path 26 to cross over each other without electrically connecting to each other. There may be any suitable number of segments in communications path 26 (e.g., two segments, three segments, four segments, five or more segments, etc.). With one illustrative arrangement, communications path 26 may have an odd number of segments (i.e., the total number of segments EV and OD taken together may be odd) and may have an even number of cross-over regions CR, to ensure that lines P and N do not flip their polarity from one end of path 26 to the other. Configurations in which path 26 is provided with an even number of segments may also be used, if desired.

The length of each segment may be, for example, about 30 to 80 microns, about 10 to 200 microns, less than 200 microns, more than 30 microns, etc. Cross-over regions CR may be about 2 to 20 microns in length or may be more than 2 microns or less than 20 microns in length (as examples). The width W of line P may be about 5 to 11 microns and the width W of line N may be about 5 to 11 microns (e.g., the widths N and P may be substantially equal). Lines N and P may be separated by a gap G of 1 to 20 microns (as an example).

Paths such as path 26 may be used in coupling unidirectional and bidirectional data transceivers, clock sources (e.g., voltage controlled oscillator outputs in a clock), or other sources and receivers of signals on an integrated circuit. The signals may have any suitable frequency (e.g., hundreds of MHz, less than 100 MHz, more than 100 MHz, more than 1 GHz, etc.).

Inductance and resistance values for intertwined conductor paths may be somewhat elevated with respect to conventional parallel line paths, but simulation results have shown that loss versus frequency results for differential transmission line pairs with intertwined conductive lines are comparable to loss versus frequency results for conventional (parallel line) paths. Because the lines in path 26 are twisted, noise immunity is improved (e.g., cross-talk may be reduced). No additional process steps are generally required when forming paths 26, because it is typically already necessary to pattern the metal layers and via layers in the dielectric stack as part of the normal process of forming a desired pattern of interconnects for an integrated circuit.

It is generally desirable to ensure that the P and N conductive lines in path 26 have uniform electrical properties along the length of the communications path, particularly in applications in which high speed signals are conveyed. The use of cross-over regions CR in communications paths such as path 26 of FIG. 2 improves uniformity because cross-over regions ensure that the P and N conductors are dispersed among a variety of environments on the surface of the integrated circuit.

Consider, as an example, a scenario in which communications path 26 passes through a variety of interconnect structures 28 in the dielectric stack of an integrated circuit. In some regions of the integrated circuit such as region HD, structures 28 will be relatively dense. In other regions of the integrated circuit such as region LD, structures 28 will be relatively sparse. During processing, CMP polishing operations may therefore tend to thin out the metal that makes up the lower half of path 26 more than the metal that makes up the upper half of path 26 (in the orientation of FIG. 2). Because path 26 includes intertwined conductive lines, however, an approximately equal number of segments of line P and line N will be present in the upper half of path 26. For example, a path that includes 51 segments may include 25 EV segments and 26 OD segments and may therefore have 25 segments of line P and 26 segments of line N in the upper half of path 26. This tends to even out proximity-based thickness variations in lines P and N and help reduce undesired irregularities of path 26.

In the example of FIG. 2, the portions of line N in even path segments EV will tend to be thinner (and more resistive) than the portions of line N in odd path segments OD, because the portions of line N in segments EV are closer to high density region HD than the portions of line N in segments OD. On the other hand, the portions of line P in odd segments OD, will tend to be thinner than the portions of line P in segments EV, because the portions of line P in segments OD are closer to high density region HD than the portions of line P in segments EV.

In paths such as path 26 of FIG. 2 that contains a number of different path segments in which the positions of lines N and P are repeatedly swapped, localized thickness variations tend to cancel each other out. In particular, any polishing-induced thinning that portions of line N in segments EV experience due to close proximity to high-density region HD will tend to be balanced by the polishing-induced thinning that the portions of line P in segments OD experience. As a result, communications paths such as differential transmission line path 26 of FIG. 2 that contain intertwined conductive lines may have conductive lines that are more evenly formed than conventional communications paths, in which the parallel lines P and N are not intertwined.

Conductors N and P may each be formed from one or more layers of metal. For example, conductor N may be formed from parallel lines in two or more metal layers in a dielectric stack. The parallel lines may be shorted to each other along their lengths by vias in a via layer of the dielectric stack. Conductor P may likewise be formed from parallel lines in two or more metal layers that are connected to each other using vias. In cross-over regions CR, the metal layers may be configured so as to avoid creating undesired short circuits. For example, if lines P and N are each formed from two metal layers, line P in cross-over regions CR may only contain metal from one metal layer and line N in cross-over regions CR may only contain metal from one metal layer (as an example).

Figure 3:
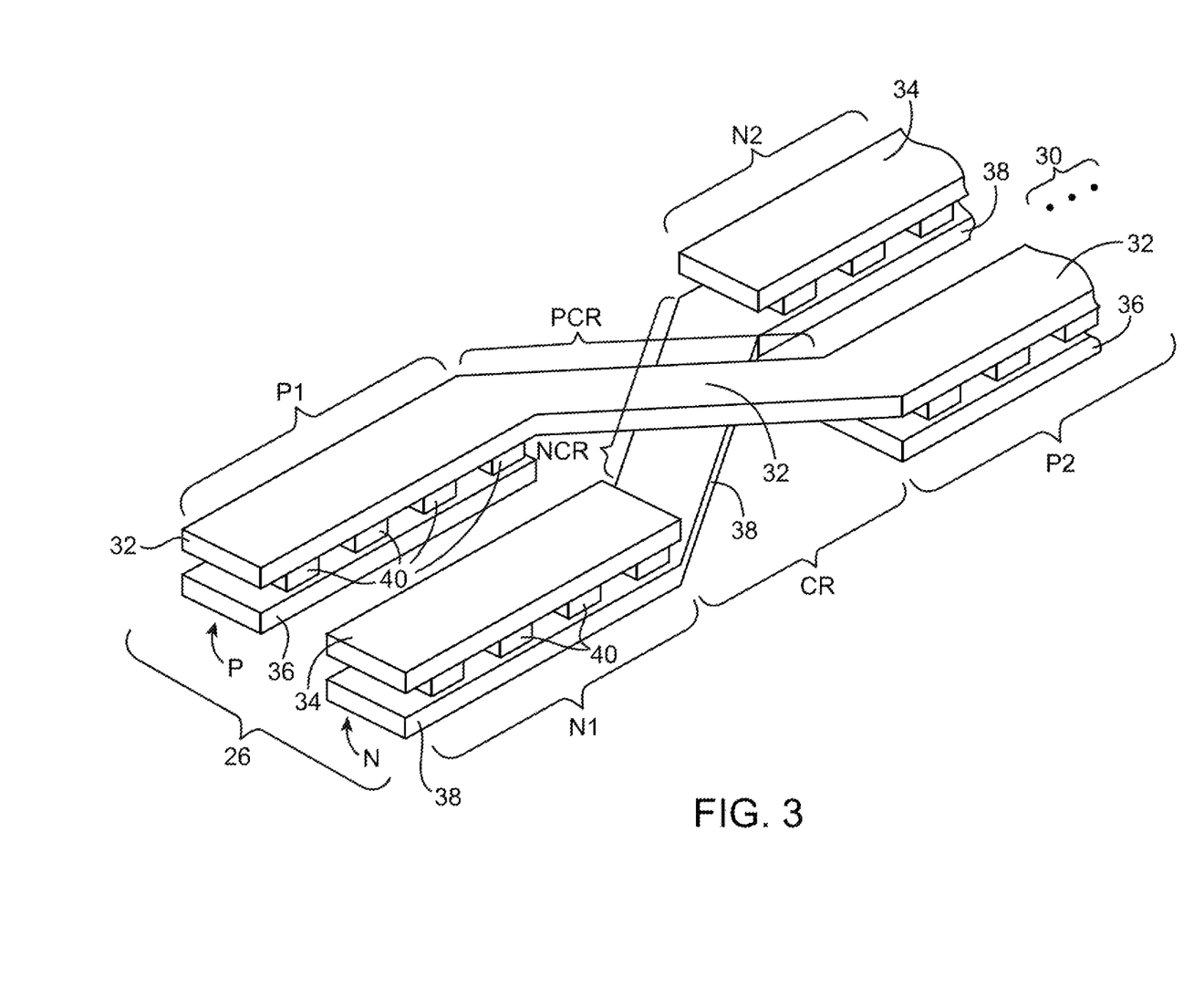
FIG. 3 is an exemplary perspective view of a portion of intertwined conductors communication path formed in two layers of the dielectric stack on an integrated circuit in accordance with an embodiment of the present invention.

An exemplary configuration is shown in FIG. 3. As shown in the perspective view of communications path 26 of FIG. 3, line P may have a first portion P1, a cross-over portion PCR, and a second portion P2. Line N may have a first portion N1, a cross-over portion NCR, and a second portion N2. Portions N1 and P1 may be conductive lines in an even segment EV (FIG. 2) of path 26 and portions N2 and P2 may be conductive lines in an odd segment OD (FIG. 2) of path 26 (as an example). The pattern used for the path structures shown in FIG. 3 may be used throughout path 26, as indicated by dots 30. In each successive cross-over region CR, the identity of the line that crosses over the top of the lines can alternate. For example, if line P crosses over line N in one cross-over region CR, line N may cross over line P in the next cross-over region CR, etc.

As shown in the FIG. 3 example, line P may contain conductive structures formed from more than one metal layer. For example, portion P1 of line P may include part of upper metal layer structure 32 (i.e., an upper metal line segment) and part of lower metal layer structure 36 (i.e., a matching lower metal line segment). Portion P2 of line P may also include part of upper metal layer structure 32 and part of lower metal layer structure 36. Vias 40 may be used to short structures 32 and 36 together along the lengths of the lines in regions P1 and P2. In cross-over portion PCR, an opening may be formed in structure 36 to accommodate the cross-over portion of line N. Structures 32 in region PCR may be used to form a conductor (e.g., a metal line segment) that provides electrical continuity between portions P1 and P2.

Line N may be structured similar to that of line P. Portion N1 of line N may include part of upper metal layer structure 34 and part of lower metal layer structure 38. Portion N2 of line N may likewise include part of upper metal layer structure 34 and part of lower metal layer structure 38. Vias 40 may be used to electrically connect structures 34 and 38 together.

In cross-over region CR, portion NCR of line N may be formed from a conductor in lower metal layer structure 38, but not structure 34. An opening may be formed in upper layer structure 34 to accommodate portion PCR of line P (formed from upper layer structure 32). In each region CR, this pattern may continue in an alternating fashion. In even regions CR, line P may cross over line N as shown in FIG. 3. In odd regions CR, line P may cross beneath line N.

The lines in region CR may be free of vias or, if desired, supplemental structures (e.g., parallel via-shorted line segments) may be provided above and below regions PCR and NCR, respectively. For example, if layer 32 is being formed from the $K^{th}$ metal layer in a dielectric stack, a line segment from the $(K+1)^{th}$ metal layer may be formed over PCR and may be connected to PCR with vias to ensure that the conductivity of path P is not unduly increased in region CR. Similarly, if layer 38 is being formed in the $(K-1)^{th}$ metal layer, an additional line segment from the $(K-2)^{th}$ metal layer in the dielectric stack may be formed directly below portion NCR of line N. Additional layers of metal may also be formed over and/or under the other portions of lines P and N (e.g., to form three-layer or four-layer lines, etc.).

Figure 4:
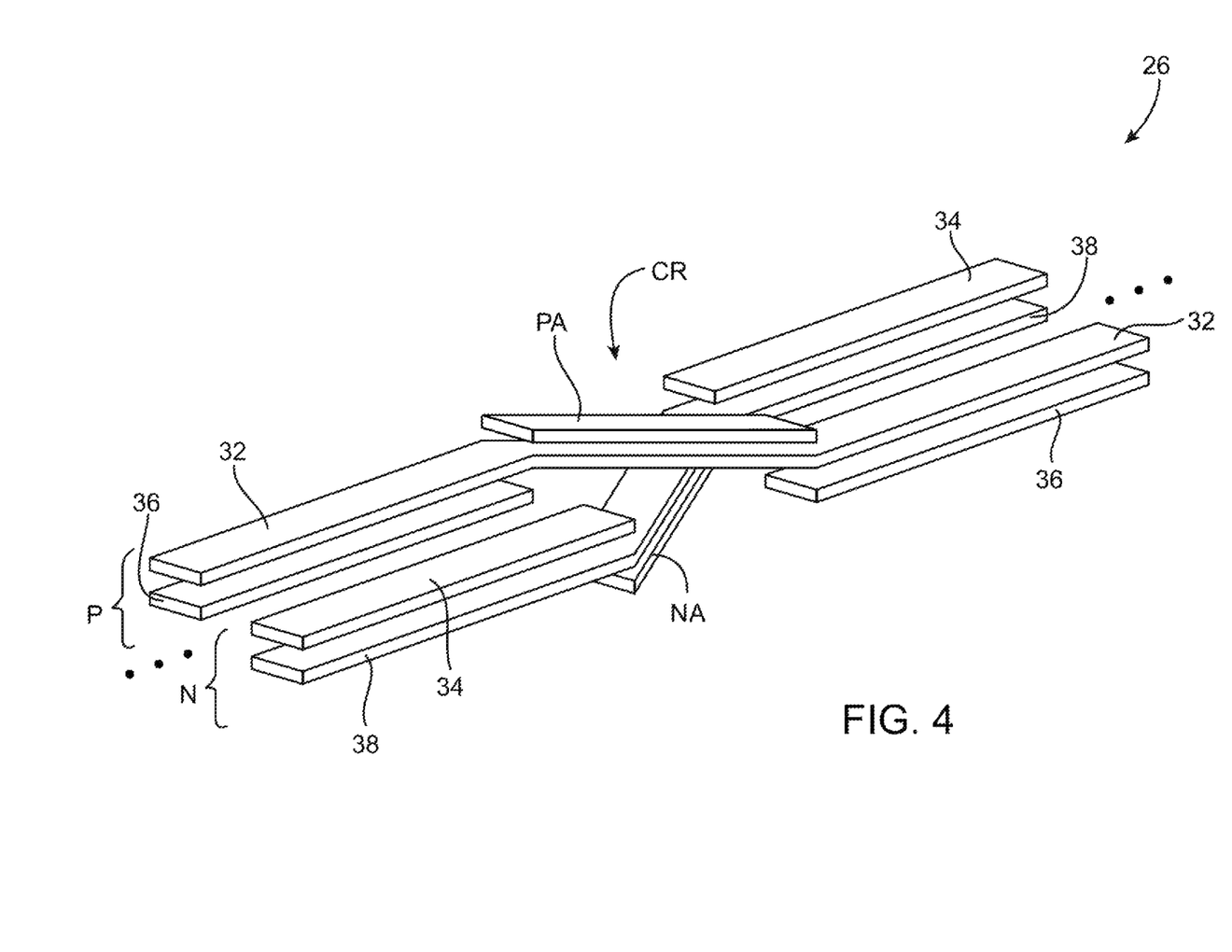
FIG. 4 is an exemplary perspective view of additional layers of metal used to form conductive lines of intertwined conductive communication paths in accordance with an embodiment of the present invention.

FIG. 4 is an exemplary perspective view in which lines N and P in communications path 26 each contain an additional metal layer in cross-over region CR. Line P may include upper metal layer structure 32 coupled to lower metal structure 36, whereas line N may include upper metal layer structure 34 coupled to lower metal structure 38. In particular, line P may have additional layer PA to make up for the loss of layer 36 in region CR and line N may have an additional layer NA to make up for the loss of layer 34 in region CR. (Vias 40 are not shown in the FIG. 5 example to avoid over-complicating the drawing). The dielectric that separates and insulates the metal structures in FIG. 4 and the other FIGS. may be silicon dioxide or other dielectric materials that are capable of forming high-resistance electrical isolation structures.

If desired, multiple additional structures for line P (not shown) such as structure PA may be provided in region CR and may be connected by vias (e.g., two additional parallel PA structures, may be formed, three additional parallel PA structures may be formed, etc.). Similarly, multiple additional structures for line N (not shown) such as structure NA may be provided in region CR and may be connected to the line using vias (e.g., two additional structures NA may be provided, three additional structures NA may be formed, etc.). Additional portions of the other parts of lines N and P may also be provided using one or more, two or more, three or more, or four or more line segments from respective metal layers connected using vias.

Figure 5:
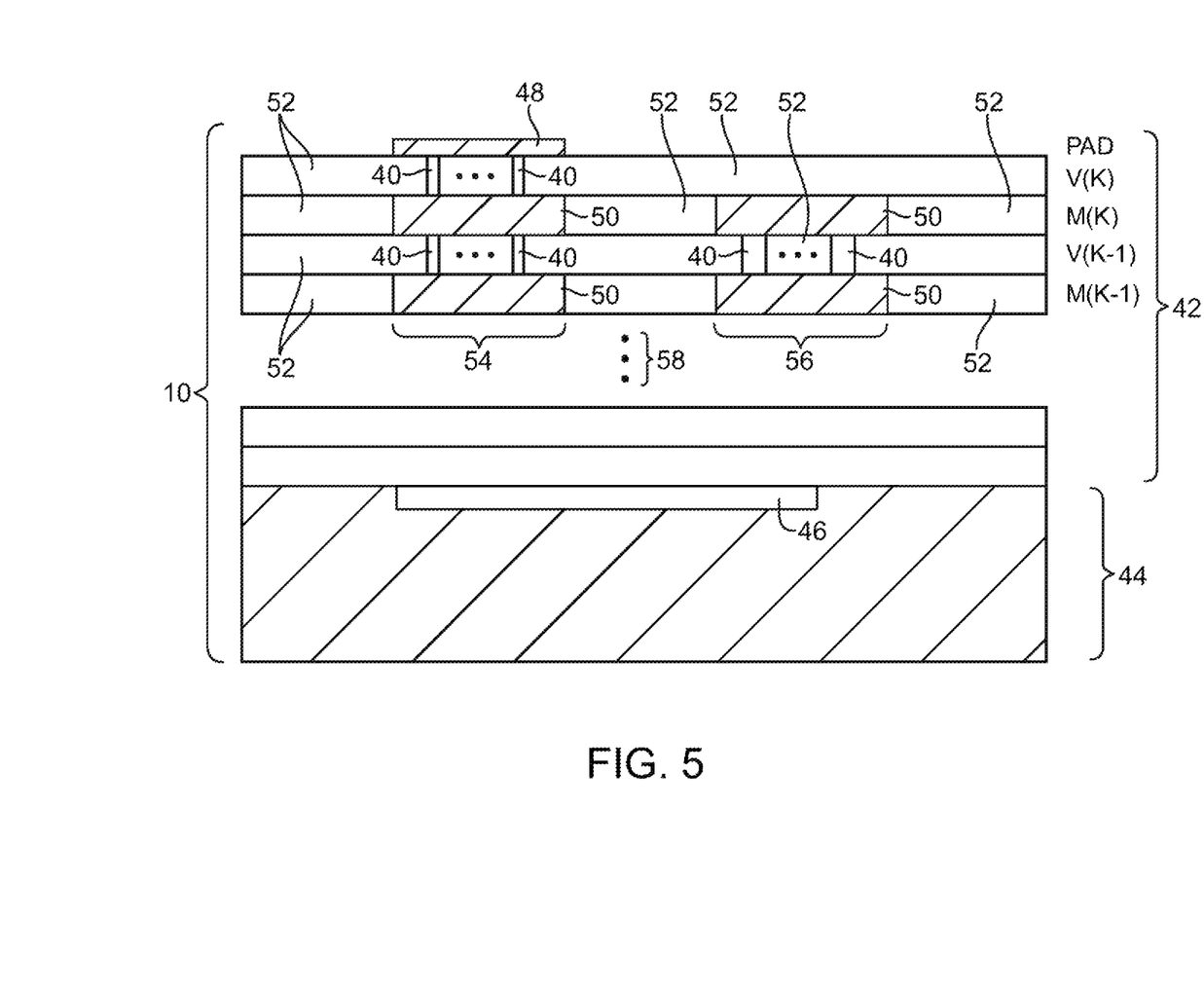
FIG. 5 is an exemplary cross-sectional side view of conductive lines of intertwined lines for a communication paths formed from one or more metal layers, a pad layer, and one or more via layers in a dielectric stack on an integrated circuit in accordance with an embodiment of the present invention.

FIG. 5 is an exemplary cross-sectional side view of a portion of a dielectric stack on an integrated circuit. As shown in FIG. 5, integrated circuit 10 may include circuit 46. Circuit 46 may be formed within integrated circuit substrate 44. Circuitry 46 may include, for example, metal-oxide-semiconductor transistors and other circuit elements. Substrate 44 may be formed from a semiconductor such as silicon (e.g., substrate 44 may be part of a silicon wafer).

Dielectric stack 42 may be formed on the surface of substrate 44. Dielectric stack may include layers such as metal layers M(K), M(K−1), etc., and interposed via layers V(K), V(K−1), etc. The uppermost layer of stack 42 (PAD) may sometimes be used in forming input-output pads and may therefore sometimes be referred to as the pad layer of dielectric stack 42.

Each of the layers of dielectric stack 42 is typically formed primarily from an insulator such as silicon dioxide or other dielectric 52. The metal layers may contain patterned metal structures such as metal lines 50 that are separated from each other by regions of dielectric 52. Via layers such as V(K) and V(K−1) may contain conductive vias 40 that are separated by regions of dielectric 52. Pad layer PAD may include conductive structures such as structure 48 (e.g., part of an input-output pad, part of the conductive lines in communications path 26, etc.). Metal lines 50 may be formed from metals such as copper. Structures in pad layer PAD may be formed from metals such as aluminum. Vias 40 may be formed from tungsten or other metals. Other metals and conductive materials may also be used for forming metal structures 50, vias 40, and pad-layer structures 48, if desired.

As shown by illustrative structure 54, multiple metal layer structures 50 and a pad structure 48 may be electrically connected to each other using layers of interposed vias 40. As shown by illustrative structure 56, pad layer structures 48 may, if desired, by omitted. There may be two or more metal layers in structures such as structures 54 and 56, as indicated by dots 58.

When viewed in cross-section along their longitudinal axes, conductive lines N and P of path 26 (as shown in FIG. 2) may each appear as shown by structure 54 (as an example) or as shown by structure 56 (as another example). Lines N and P may also be formed using metal layers that are lower in the dielectric stack. The use of illustrative structures 54 and 56 of FIG. 5 formed at or near the outermost surface of dielectric stack 42 may, however, reduce substrate coupling losses.

Figure 6:
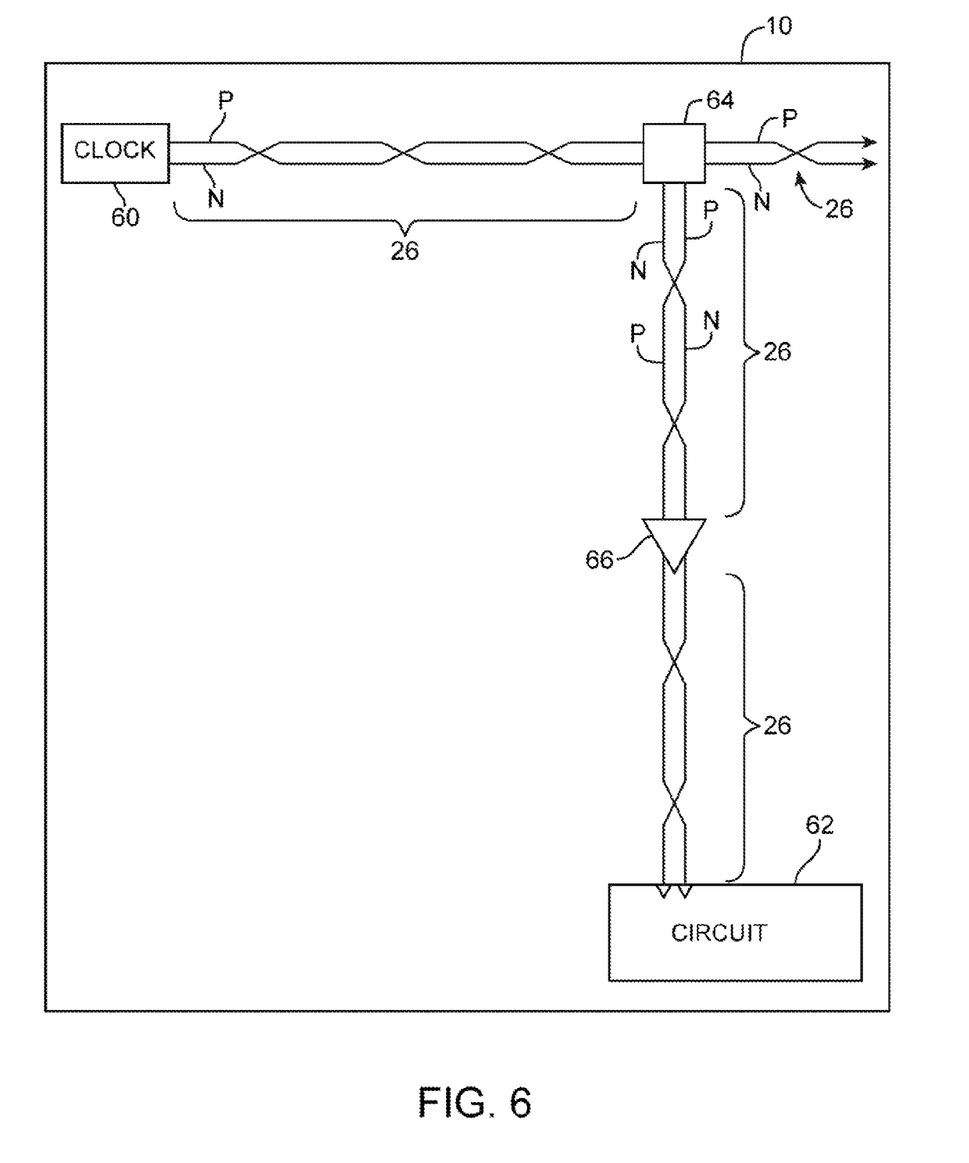
FIG. 6 is a top view of an illustrative integrated circuit including intertwined conductive lines to convey signals in accordance with one embodiment of the present invention.

A top view of an exemplary integrated circuit showing how communications paths with intertwined conductive lines may be used to convey signals between various blocks of circuitry is shown in FIG. 6. As shown in FIG. 6, integrated circuit may have circuits such as clock circuit (which serves as a signal transmitter in the FIG. 6 example) and circuit 62 (which serves as a signal receiver in the FIG. 6 example). Differential transmission line pairs such as paths 26 with intertwined conductors P and N may be used to route signals across integrated circuit 10. In some situations, paths 26 may be used to form direct connections between signal transmitters and signal receivers. For example, one of intertwined conductor paths 26 may be used to form communications path 14 between circuits A and B in FIG. 1. In other situations, one or more buffer circuits may be interposed between a signal transmitter and signal receiver. For example, buffers such as buffer circuit 64 may be interposed within paths 26 to help fan out signals. As another example, portions of communication paths 26 may be provided with interposed buffers such as buffer 66 to ensure that the strength of the signals that are being transmitted are not degraded. Signals distributed in this way may include clock signals, trigger signals, and other signals that are distribute to multiple receivers on circuit 10.

With one suitable arrangement, paths 26 may be used in distributing two-phase clock signals. With this type of arrangement, path P may be used for distributing a first clock signal (e.g., a 0° clock phase) and path N may be used for distributing a second clock signal (e.g., a 180° clock phase that is complementary to the 0° clock phase). The clock signals may be generated within clock 60 and may be received by circuit 62 (e.g., a logic circuit that is clocked by the clock signal). Other circuits on integrated circuit 10 may likewise receive the two-phase clock signal from clock 60 using paths 26. If desired, other types of signals can be distributed over paths 26. The use of clock signals in the illustrative signal distribution network of FIG. 6 is merely illustrative.

The foregoing is merely illustrative of the principles of this invention and various modifications can be made by those skilled in the art without departing from the scope and spirit of the invention.

What is claimed is:

1. A communication path comprising:
    an intertwined pair of conductive paths formed in a dielectric stack on an integrated circuit, wherein the intertwined pair of conductive paths comprises metal layer structures and vias in the dielectric stack, wherein the dielectric stack includes dielectric layers comprising alternating metal layers and via layers, wherein the vias are formed in the via layers, and wherein the metal layer structures are formed in at least three different ones of the metal layers in the dielectric stack.

2. The communication path defined in claim 1, wherein the intertwined pair of conductive paths includes a first path and a second path, wherein the metal layer structures and the vias form a plurality of segments, wherein the first and second conductive paths in the intertwined pair of conductive paths run parallel to each other in each segment, and wherein the intertwined pair of conductive paths includes a plurality of cross-over regions in which the first and second conductive paths cross each other.

3. The communication path defined in claim 1, wherein the metal layer structures and the vias form a plurality of segments, wherein the intertwined pair of conductive paths are parallel to each other in each segment of the plurality of segments, and wherein each segment of the plurality of segments is formed between respective cross-over regions in which a first path in the pair of conductive paths crosses a second path in the pair of conductive paths.

4. A pair of conductive paths comprising:
    a first conductive path comprising a first layer of conductive structures and a second layer of conductive structures; and
    a second conductive path comprising a third layer of conductive structures that lies in a first common layer of a dielectric stack with the first layer of conductive structures and a fourth layer of conductive structures that lies in a second common layer of the dielectric stack with the second layer of conductive structures, wherein the first and second conductive paths form a differential transmission line pair forming a plurality of cross-over regions wherein at each cross-over region the first conductive path crosses the second conductive path, wherein at each cross-over region the first conductive path is electrically insulated from the second conductive path, wherein the first conductive path further includes a first set of at least three conductive vias shorting the first and second layers of conductive structures in parallel along the length of the first conductive path between each pair of consecutive cross-over regions, and wherein the second conductive path further includes a second set of at least three conductive vias shorting the third and fourth layers of conductive structures in parallel along the length of the second conductive path between each pair of consecutive cross-over regions.

5. The pair of conductive paths defined in claim 4, wherein the first and second conductive paths include a portion of conductive structures from a pad layer associated with the dielectric stack.

6. The pair of conductive paths defined in claim 4, wherein the first and the second conductive paths each have a width of 5 to 11 microns.

7. The pair of conductive paths defined in claim 4, wherein the first and the second conductive paths are parallel to one another at a region between respective cross-over regions of the plurality of cross-over regions.

8. The pair of conductive paths defined in claim 4, wherein a region of the pair of conductive paths located between respective cross-over regions of the plurality of cross-over regions has a length ranging between 10 to 200 microns.

9. A communication path comprising:
    a first path comprising first and second metal layers in an integrated circuit dielectric stack; and
    a second path comprising at least the first and second metal layers, wherein the first and second paths form segments, wherein the segments include vias, wherein the first and second paths are parallel to one another in each of the segments, wherein each segment is formed between respective cross-over regions in which the first path crosses the second path, wherein the first path is electrically insulated from the second path at the respective cross-over regions, and wherein the first path includes at least the first metal layer and a third metal layer that is different than the first and second metal layers in the integrated circuit dielectric stack within respective cross-over regions.

10. The communication path defined in claim 9, wherein a length of at least one of the segments ranges between 30 to 80 microns.

11. The communication path defined in claim 9, wherein the segments have lengths of less than 200 microns.

* * * * *